United States Patent [19]

Okamoto

[11] Patent Number: 4,924,223
[45] Date of Patent: May 8, 1990

[54] DIGITAL CODE CONVERTER FORMED OF A DECREASED NUMBER OF CIRCUIT ELEMENTS

[75] Inventor: Toshiyuki Okamoto, Tokyo, Japan
[73] Assignee: NEC Corporation, Tokyo, Japan
[21] Appl. No.: 264,556
[22] Filed: Oct. 31, 1988
[30] Foreign Application Priority Data

Oct. 30, 1987 [JP] Japan ............................. 62-276609

[51] Int. Cl.$^5$ ............................................. H03M 7/30
[52] U.S. Cl. ..................................... 341/95; 341/102; 341/122
[58] Field of Search ..................... 341/61, 93, 95, 102, 341/122, 51

[56] References Cited

U.S. PATENT DOCUMENTS

| | | | |
|---|---|---|---|
| 4,520,347 | 5/1985 | Cambell, Jr. .......................... | 341/93 |
| 4,623,874 | 11/1986 | Thoma .................................. | 341/95 |
| 4,704,600 | 11/1987 | Uchimura et al. ................... | 341/122 |
| 4,706,265 | 11/1987 | Furukawa ............................. | 341/95 |

*Primary Examiner*—William M. Shoop, Jr.
*Assistant Examiner*—Gary J. Romano
*Attorney, Agent, or Firm*—Sughrue, Mion, Zinn, Macpeak & Seas

[57] ABSTRACT

A code converter includes a signal converter converting an input digital signal into an intermediate digital signal of two's complement. A subtracter has a minuend input node, receiving lower bits of the intermediate digital signal, and a subtrahend input node. A digital integrator receives an output from the subtracter, a digital comparator receives an output from the digital integrator, a delay unit receives an output from the digital comparator to execute a one-sampling period delay. An output from the delay unit is applied to the subtrahend input node of the subtracter, and an adder receives the remaining upper bits of the intermediate digital signal and the output from the digital comparator, a converted output digital signal being produced from the adder.

4 Claims, 2 Drawing Sheets

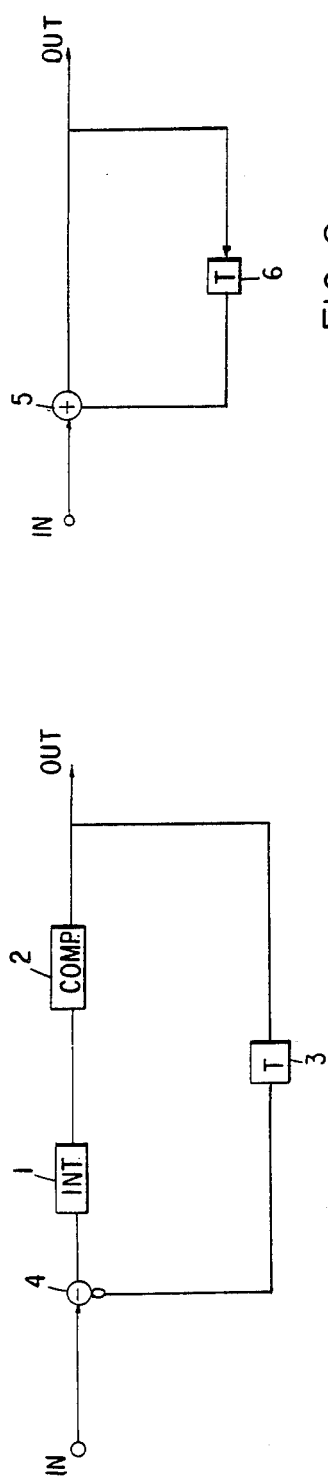
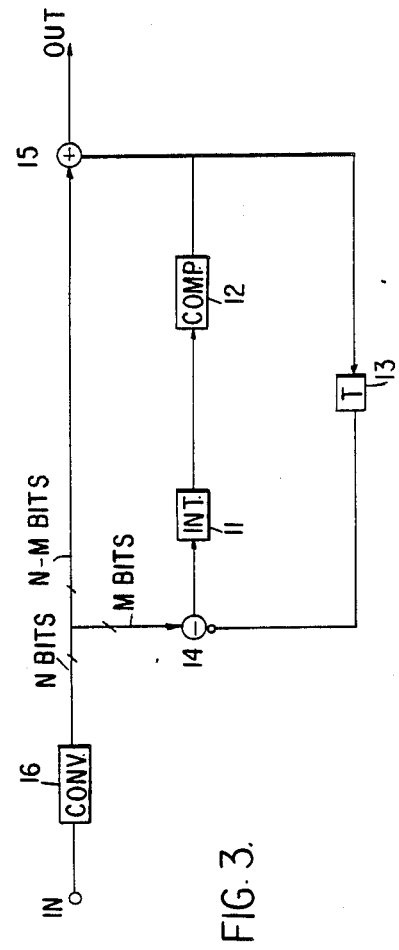
FIG. 1. PRIOR ART
FIG. 2. PRIOR ART
FIG. 3.

DIGITAL CODE CONVERTER FORMED OF A DECREASED NUMBER OF CIRCUIT ELEMENTS

BACKGROUND OF THE INVENTION

1. Field of the Invention

The present invention relates to a code converter wherein a digital code encoded into any desired bit length at any desired sampling frequency is converted into a digital code encoded into a shorter bit length at the same sampling frequency.

2. Description of the Related Art

In general, in a case where a digital code of n bits is rounded into a digital code of m bits (m<n), S/N degrades $6.0 \times (n-m)$ dB. The degradation, however, can be improved by employing an oversampling technique. The oversampling technique is a technique wherein a high S/N characteristic and a good gain tracking characteristic are attained with a short bit length by encoding at a high sampling frequency as compared with a signal frequency.

A conventional code converter employing the oversampling technique is shown in FIG. 1. The digital integrator 1 in FIG. 1 is configured of an adder 5 and a one-sample delay unit 6 as shown in FIG. 2. The digital comparator 2 is realized by rounding off lower bits.

In the shown code converter, an input signal applied to the input terminal IN is subtracted by a subtracter 4 with an output signal produced at an output terminal OUT and delayed for one sampling period by a delay unit 3, to obtain a difference signal. The difference signal is integrated by a digital integrator 1. The integrated output is rounded into a bit length shorter than that of the input signal by a digital comparator 2.

Letting Q(t) denotes quantization noise developed by the code converter, and I(t) and 0(t) denote the input signal and the output signal, respectively, a relational formula is found and then is Z-transformed, thereby to obtain the following equation:

$$O(Z) = I(Z) + (1 - Z^{-1}) Q(Z) \qquad (1)$$

As apparent from Eq. (1), the quantization noise is differentiated and is then transferred to the output, so that quantization noise components within a band become very small.

In the prior-art code converter stated above, the comparatively upper bits of the output code do not change from those of the input code, so that the operations of the digital integrator 1, the digital comparator 2 and the one-sample delay unit 3 become wasteful. This leads to enlarging a hardware quantity or requiring a large number of circuit elements, which is unsuitable for an integrated circuit.

Further, in general, the quantization noise is not white noise, but it correlates to the frequency or amplitude level of the input signal, and there arises a frequency or level at which the S/N characteristic or gain tracking characteristic degrades abruptly. As an expedient which is often adopted for improving such a phenomenon, there is well known a method in which dithers are applied to the input of the digital comparator 2. However, a circuit for generating the dithers is required, and the optimum spectrum of the dithers need to be selected depending upon the input signal. Accordingly, increase in hardware quantity or in the number of circuit elements and complication in design are incurred.

Besides, when the digital code is expressed by a sign magnitude form, the gain tracking characteristic (linearity) degrades due to round-off.

SUMMARY OF THE INVENTION

It is, therefore, a primary object of the present invention to provide a code converter constituted of a decreased number of circuit elements so as to be suitable for being formed in a semiconductor integrated circuit having a high integration density.

It is another object of the present invention to provide a code converter showing improved S/N and gain tracking characteristics without using additional circuit.

In accordance with the present invention, there is provided a code converter constructed of a signal converter for converting an input digital signal into a two's complement signal, a subtracter whose minuend side receives lower bits of the two's complement signal, an integrator which receives an output of the subtracter, a digital comparator which receives an output of the integrator, a one-sample delay unit which receives an output of the digital comparator and whose output is applied to a subtrahend side of the subtracter, and an adder which receives upper bits of the two's complement signal and the output of the digital comparator, an output of the adder being delivered as an output digital signal.

According to the present invention, only lower bits of input two's complement signal to be converted are processed for code conversion, while remaining upper bits are not processed. Therefore, the system structure is simplified to allow to constitute the code converter with a decreased number of circuit elements.

Furthermore, as explained in detail later, dithers are self-applied to the digital comparator without using a particular generator of dithers, which results in excellent S/N and gain tracking characteristics.

BRIEF DESCRIPTION OF THE DRAWINGS

The above and further objects, features and advantages of the present invention will become more apparent from the following detailed description taken in conjunction with the accompanying drawings, wherein:

FIG. 1 is a circuit block diagram of a conventional code converter

FIG. 2 is a circuit block diagram of a digital integrator used in a code converter shown in FIG. 1;

FIG. 3 is a circuit diagram of a code converter according to a preferred embodiment of the present invention.

DESCRIPTION OF THE PREFERRED EMBODIMENT

Figure 4:
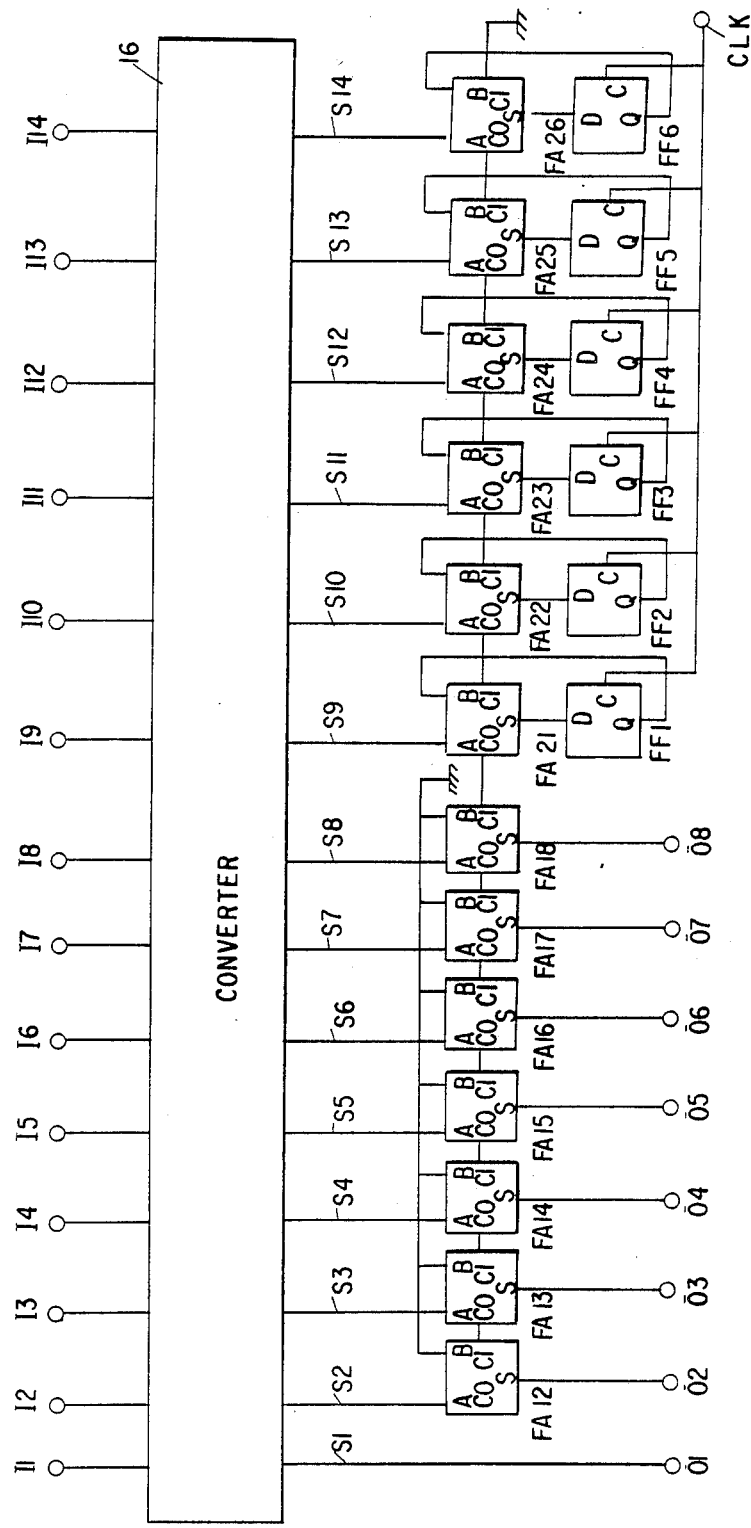
FIG. 4 is a detailed circuit diagram of the code converter shown in FIG. 3.

Referring now to FIG. 3, the code converter according to the preferred embodiment of the present invention has a signal converter 16 converting an input signal (typically n bit digital signal) IN into an n bit digital signal of two's complement. Upper n−m (m<n) bits of the converted digital signal are directly applied to an adder 15. Lower m bits of the converted digital signal are applied to a subtracter 14 together with an output from a one-sampling period delay unit 13 to obtain a difference signal. The difference signal is applied to a digital integrator 11 and then applied to a digital comparator 12. The output of the digital comparator 12 is applied to the adder 15 and the delay unit 13. An output signal OUT is derived from the adder 15.

FIG. 4 is a detailed circuit diagram of an embodiment of the present invention. The circuit shown in FIG. 4 corresponds to a case where, in the circuit shown in FIG. 3, the lower 6 bits of the converted digital signal of 14 bits are oversampled and converted into a 1 bit signal. In the case where the output of the digital comparator 12 is of 1 bit, the construction of hardware is particularly simplified in correspondence with discriminating whether or not the output of the digital integrator 11 overflows.

The 14 bit input signal (I1 to I14) is converted into 14 bit digital signal (S1 to S14) of two's complement by the signal converter 16. The converted digital signal consists of the MSB (sign bit) S1 and the succeeding data S2 to S14. The bits S2 to S8 become the inputs A of full adders FA12 to FA18. The following 6 bits S9 to S14 are respectively connected to the input terminals A of full adders. FA21 to FA26. The outputs S of the full adders FA21 to FA26 are respectively accepted by flip-flops FF1 to FF6 in synchronism with a clock CLK which has the same frequency as a sampling frequency, and the outputs Q of the flip-flops FF1 to FF6 are respectively connected to the other inputs B of the full adders FA21 to FA26. The carry outputs CO of the respective full adders FA22 to FA26 are connected to the carry inputs CI of the full adders FA21 to FA25 which are 1-bit higher, and the carry input CI of the full adder FA26 is grounded The other input B of each of the full adders FA12 to FA18 is grounded, and the carry output CO of the full adder FA21 is connected to the carry input CI of the full adder FA18. The carry outputs CO of the respective full adders FA13 to FA18 are connected to the carry inputs CI of the full adders FA12 to FA17 which are 1-bit higher.

The operation of the digital integrator 11 is formed by the full adders FA21 thru FA26 and flip-flops FF1 thru FF6 in FIG. 4. Further, the digital comparator 12 is realized by the carry operation of the full adder FA21, and the subtracter 14 is realized in such a way that a multi-input adder formed of the full adders FA21 to FA26 is reset when its operation has overflowed. This becomes possible owing to the fact that the bit signals I9–I14 are always values of the plus sign. Next, it is to be understood that the adder 15 is realized by the full adders FA12 to FA18. Although the output of the digital comparator 12 is set at 1 bit in the embodiment shown in FIGS. 3 and 4, it is to be understood that a digital comparator 12 can be similarly constructed even for a multi-bit output.

Further, in a case where a D/A converter is connected to receive output signal OUT so as to convert the output signal OUT into an analog signal having a reference level of grounding potential, it becomes simpler in hardware to execute an analog addition instead of using the digital adders FA12 to FA18, and hence, the converted input code bits S1 to S8 and the carry output code of the full adder FA21 may well be combined to form the output signal OUT.

As described above, the present invention oversamples only any desired number of lower bits of a digital signal of two's complement converted from an input signal, while the remaining upper bits are output as they are, whereby hardware can be simplified to require a decreased number of circuit elements. Moreover, the input signal is converted into a form of two's complement before the execution of code conversion, whereby the lower bits can be always processed as values of the plus sign, resulted in a simplified circuit configuration.

Furthermore, since the input signal is converted into a two's complement form to oversample its lower bits, the bit signal to be oversampled has always the plus sign. Therefore, when the signal of the plus sign smaller than a step width expressed by the LSB of the converter output has been input to the code converter, the level of the signal to be oversampled is zero, whereas when the signal of the minus sign with respect to the step width expressed by the LSB of the converter output has been input to the code converter, the level of the signal to be oversampled becomes equal to the step width. This is equivalent to the application of dithers to the input of the digital integrator of the oversampling circuit, and is accordingly effective to attain an S/N characteristic and a gain tracking characteristic which are better even for an input digital signal (IN) in a sign magnitude form.

What is claimed is:

1. In a code converter wherein an input digital code having any desired bit length is converted into an output digital code having another bit length shorter than said desired bit length; the code converter comprising a signal converter converting said input digital code into an intermediate digital code in a form of two's complement, said intermediate digital code consisting of any desired number of upper bits and remaining lower bits, a subtracter having a minuend side input node receiving said lower bits and having a subtrahend side input node, an integrator receiving an output of said subtracter, a digital comparator receiving an output of said integrator, a one-sampling period delay unit receiving an output of said digital comparator to execute a time delay of one sample period, an output of said one-sample period delay unit being applied to said subtrahend side of said subtracter, and an adder receiving said upper bits and an output from said digital comparator, an output of said adder being delivered as said output digital code.

2. The code converter as claimed in claim 1, wherein said adder is a plurality of full adders each having a first input node receiving one bit of said upper bits, a second input node being grounded, an output node producing one bit of said output digital code, a carry output node and a carry input node, said carry output node of said full adder receiving one of said upper bits being connected to said carry input node of said full adder receiving a bit of said upper bit higher than said one of said upper bits with one bit.

3. The code converter as claimed in claim 2, wherein said integrator is a plurality of pairs of another full adder and a flip-flop, each of said other full adders having a first input node receiving one bit of said lower bits, a second input node, a carry input node, a carry output node and an output node, said carry output node of said other full adder receiving one bit of said lower bits being connected to said carry input node of said other full adder receiving a bit of said lower bits which is higher than said one bit of said lower bits with one bit, and said flip-flop having an input node connected to said output node of said other full adder in the same pair, an output node connected to said second input node of said other full adder in the same pair and a clock input node receiving a sampling clock.

4. The code converter as claimed in claim 3, wherein said digital comparator is a means for applying a carry signal from said carry output node of said other full adder receiving a highest bit among said lower bits to said carry input node of said full adder receiving a lowest bit among said upper bits, and said subtracter is a means for resetting said other full adders when an adder circuit composed of said other full adders overflows.

* * * * *